(12) United States Patent
Kulkarni et al.

(10) Patent No.: US 8,440,505 B2
(45) Date of Patent: May 14, 2013

(54) SEMICONDUCTOR CHIPS INCLUDING PASSIVATION LAYER TRENCH STRUCTURE

(75) Inventors: Deepak Kulkarni, Wappingers Falls, NY (US); Michael W. Lane, Glade Spring, VA (US); Satyanarayana V. Nitta, Poughquag, NY (US); Shom Ponoth, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 402 days.

(21) Appl. No.: 12/695,515

(22) Filed: Jan. 28, 2010

(65) Prior Publication Data
US 2010/0187689 A1 Jul. 29, 2010

Related U.S. Application Data

(60) Provisional application No. 61/148,059, filed on Jan. 29, 2009.

(51) Int. Cl.
*H01L 21/44* (2006.01)

(52) U.S. Cl.
USPC .................................. 438/113; 257/E21.599

(58) Field of Classification Search ........... 257/E21.599; 438/113–114, 107–108, 118, 462, 612–613, 438/618, 634, 637, 751
See application file for complete search history.

(56) References Cited

U.S. PATENT DOCUMENTS

2009/0085186 A1* 4/2009 Meyer ........................... 257/690
2009/0179304 A1* 7/2009 Takata .......................... 257/620

OTHER PUBLICATIONS

Leung, S.Y.Y., et al.; "Influence of Chemistry and Applied Stress on Reliability of Polymer and Substrate Interfaces"; Electronic Components and Technology Conference; p. 581-585; 2000.
Wang, Guotao, et al.; "Packing Effects on Reliability of Cu/Low-k Interconnects"; IEEE Transactions on Device and Material Reliability; vol. 3, No. 4; p. 119-128; Dec. 2003.
Zhai, Charlie Jun, et al.; "Investigation and Minimization of Underfill Delamination in Flip Packages"; IEEE Transactions on Device Materials and Reliability; vol. 4, No. 1; p. 86-91; Mar. 2004.

* cited by examiner

*Primary Examiner* — (Vikki) Hoa B Trinh
(74) *Attorney, Agent, or Firm* — Cantor Colburn LLP; Matthew Zehrer

(57) ABSTRACT

An integrated circuit including an active region a passive region and a cut line in the passive region includes a passivation layer that includes an outer nitride layer over an oxide layer. The integrated circuit also includes a crack stop below the passivation layer and in the passive region, and a solder ball in the active region. The passivation layer has a trench formed therein in a location that is further from the active region than the crack stop and closer to the active region than the cut line, the trench passing completely through the outer nitride layer and a least a portion of the way through the oxide layer.

6 Claims, 5 Drawing Sheets

SEMICONDUCTOR CHIPS INCLUDING PASSIVATION LAYER TRENCH STRUCTURE

BACKGROUND

This non-provisional application claims the benefit of the provisional application filed with the United States Patent and Trademark Office as Ser. No. 61/148,059 entitled "Semiconductor Chips Including Passivation Layer Trench", filed Jan. 29, 2009.

The present invention relates to electrical circuits, and more specifically, to reducing the effects created when a wafer containing multiple integrated circuits is cut.

In integrated circuits formed on a Si substrate, delamination, driven by coefficient of thermal expansion (CTE) mismatch between the Si substrate and package, is a dominant failure mode. This problem is exacerbated at bi-material interfaces such as interfaces between underfill and die passivation or underfill and substrate solder mask. The problem may be even worse if the underfill is imperfect.

A delamination initiated from the die edge takes the form of an interfacial microcrack. In addition, initial delamination may also be caused by formation of microcracks (possible during dicing) or voids during dispensing process or surface contamination. As some initial underfill flaws are unavoidable, preventing flaw propagation as an unstable crack is important.

SUMMARY

According to one embodiment of the present invention, an integrated circuit is provided. The integrated circuit includes an active region and a passive region and a cut line in the passive region. The integrated circuit includes a passivation layer that includes an outer nitride layer over an oxide layer and a crack stop below the passivation layer and in the passive region. The integrated circuit also includes a solder ball in the active region. The passivation layer has a trench formed therein in a location that is further from the active region than the crack stop and closer to the active region than the cut line, the trench passing completely through the outer nitride layer and a least a portion of the way through the oxide layer.

Another embodiment of the present invention is directed to a method of forming a first integrated circuit. The method of this embodiment includes forming a plurality of integrated circuits on a wafer including a passivation layer, defining cut lines between the integrated circuits, and forming a trench around each of the integrated circuits between the cut lines and integrated circuit. Forming a trench includes depositing a layer of photoresist on top of the passivation layer; exposing the passivation layer in a region between the integrated circuit and the cut lines by patterning and etching the photo resist; etching the passivation layer; and cutting the wafer along the cut lines.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
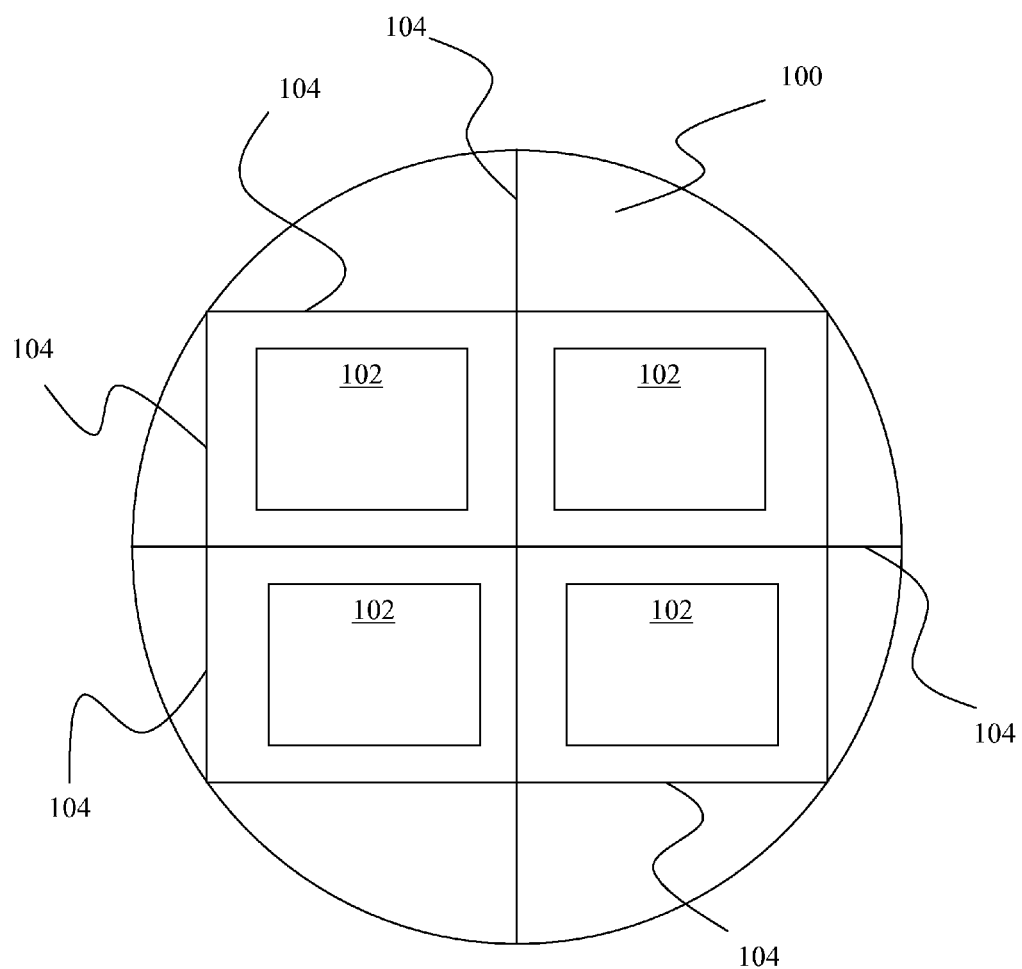
FIG. 1 shows a prior art wafer having multiple integrated circuits (chips) located thereon.

With reference now to FIG. 1, a top view of a prior art wafer 100 that includes four chips 102 is shown. To separate the chips 102 the wafer 100 needs to be cut along cut lines 104. Of course, the location of the chips 102 and the cut lines 104 shown in FIG. 1 is arbitrary and may vary depending on the context. The cut lines 104 form the outer edge of each chip 102. It is from these edges that cracks and delamination may occur. Objects of the present invention are directed towards reducing or eliminating the effects of such cracks or delamination.

Figure 2:
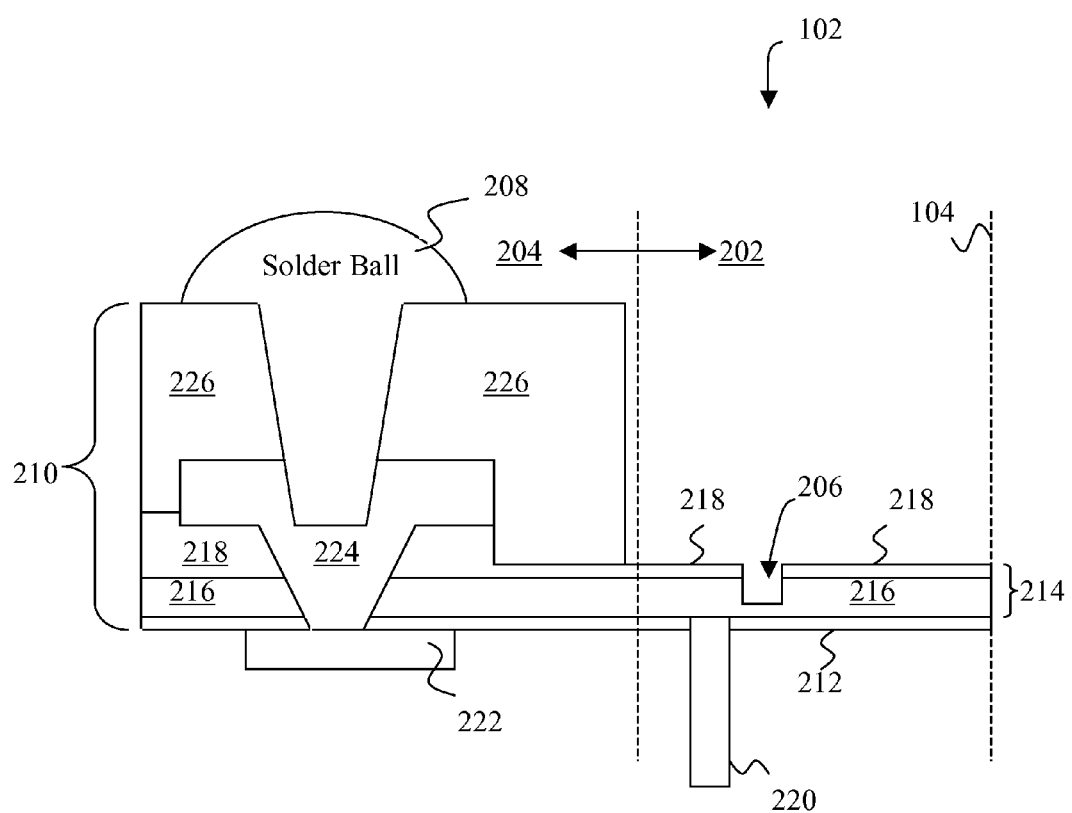
FIG. 2 shows a portion of a chip that includes embodiments of the present invention.

FIG. 2 shows a portion of an example of single chip 102 according to an embodiment of the present invention. The chip 102 is cut from a wafer (not shown) along cut line 104. The chip 102 includes a passive area 202 and an active area 204. The passive area 202 is a portion of the chip 102 that does not include any active elements. The active area 204 is the portion of the chip 102 that includes active elements. The cut line 104 will always exist in the passive area 202. According to an embodiment of the invention, the chip 102 includes trench 206 to disrupt the progress of a crack or delamination that begins at the cut line 104 from reaching the active area 204. In one embodiment, the trench 206 is located in the passive area.

The chip 102 may be a so-called "flip-chip." A flip chip, also known as Controlled Collapse Chip Connection or its acronyn, C4, is a method for interconnecting semiconductor devices, such as integrated circuit (IC) chips, to external circuitry with solder bumps 208 that have been deposited onto the chip pad 210. The solder bump 208 is deposited on the chip pads 210 on the top side of the wafer during the final wafer processing step. In order to mount the chip 102 to external circuitry (e.g., a circuit board or another chip or wafer), it is flipped over so that its top side faces down, and aligned so that its pads align with matching pads on the external circuit, and then the solder ball 208 is flowed to complete the interconnect.

In more detail, the chip 102 includes a base nitride layer 212. The base nitride layer 212 is covered by a passivation layer 214 that includes an oxide layer 216 and an outer nitride layer 218. The passive area 202 includes a trench 206. In one embodiment, the trench 206 extends all of the way through the outer nitride layer 218. In one embodiment, the trench 106 extends a portion of the way though the oxide layer 216 and extends all of the way through the nitride layer 218.

In one embodiment, the chip may include a crack stop 220. The crack stop is located on a side of the base nitride layer 212 opposite the oxide layer 216. In one embodiment, the crack stop 220 is made of copper. In one embodiment, the location of the trench 206 is arranged such that it is as close to the crack stop 220 as possible. Similar to the trench 206, the crack stop 220 should be located in the passive area 202. In other cases the crack stop 220 can be made as close to the expected dice (cut) line while maintaining the crack stop integrity.

The active area 204 includes a solder connection base 222 that passes through the base nitride layer 212 and partially into the oxide layer 216. The solder connection base 222 is coupled to a solder ball receiver 224 that receives a portion of the solder ball 208. The solder ball receiver passes through the outer nitride layer 218 and through the oxide layer 216 to couple to the solder connection base 222. The solder ball 208 also passes through an encapsulation layer 226 that encapsulates the active area 204.

Figure 3:
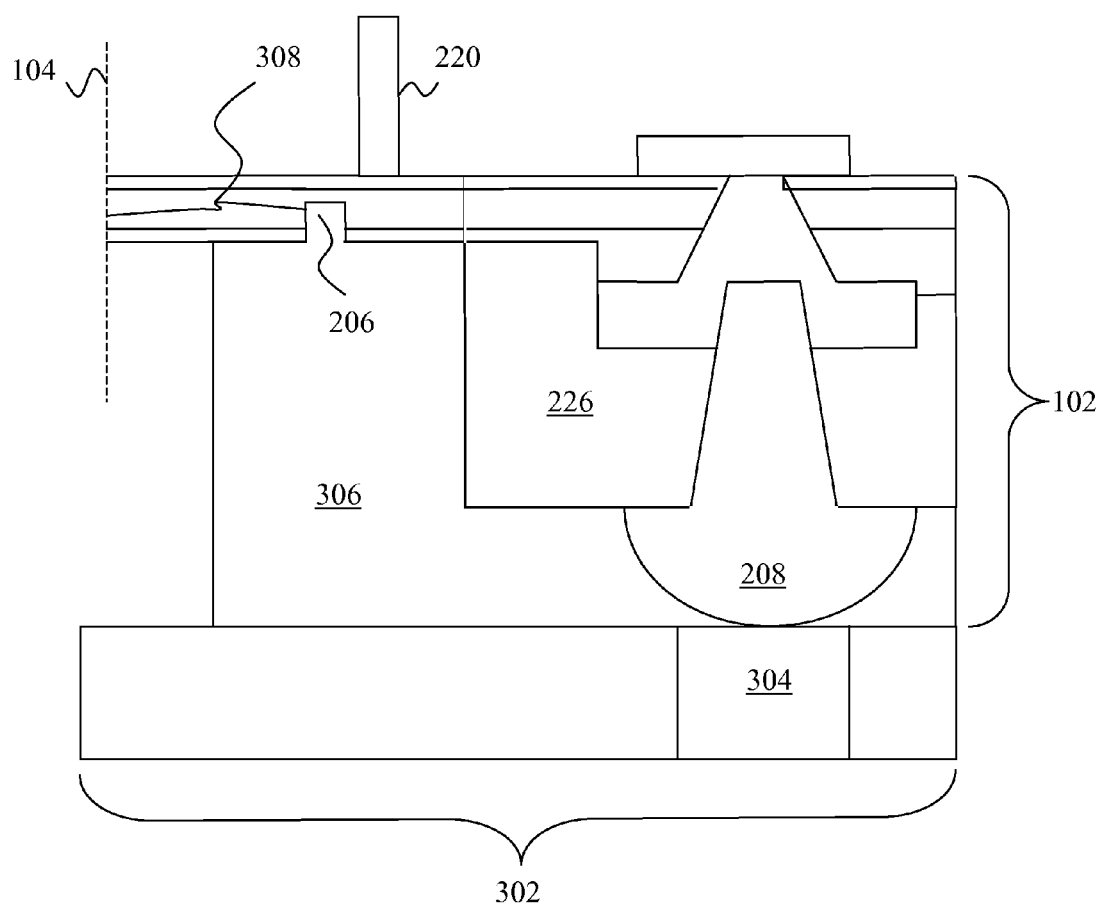
FIG. 3 shows the portion of the chip shown in FIG. 1 placed in a layer of underfill.

FIG. 3 shows the chip 102 after it has been flipped over and connected to an external circuit 302. The external circuit 302 includes a connection portion 304 that is mated to the solder ball 208. As is well known in the art, after a bond between the connection portion 304 and the solder ball 208 is created (typically by flowing the solder ball 208) an area between the chip 102 and the external circuit 302 is filled with a layer underfill 306. The underfill 306 also flows into the trench 206.

In one embodiment, the trench 206 is continuous around an edge of the chip. The trench 206, as discussed above, fills with underfill 306 during the flip chip process. The ligaments formed with the underfill 306 in the trench 206 increases the area of contact between the underfill and chip 102. As can be seen in FIG. 3, a crack or delamination (shown by reference numeral 308) is stopped at the trench 206, thus, keeping the crack or delamination from reaching the active area of the chip 102. Further, the underfill 306 in the trench 206 may provide better adhesion of encapsulation layer 226 to the chip 102 and prevent propagation of micro-cracks (caused in dicing or from surface contamination) from affecting the crack stop 220.

In one embodiment, the shape of the trench 206 may be optimized (thicker) on the corners of the chip where the largest stresses due to CTE are built. The depth/width ratio (aspect ratio) of the trench 206 may be optimized to minimize stress and, hence, delamination.

Figure 4:
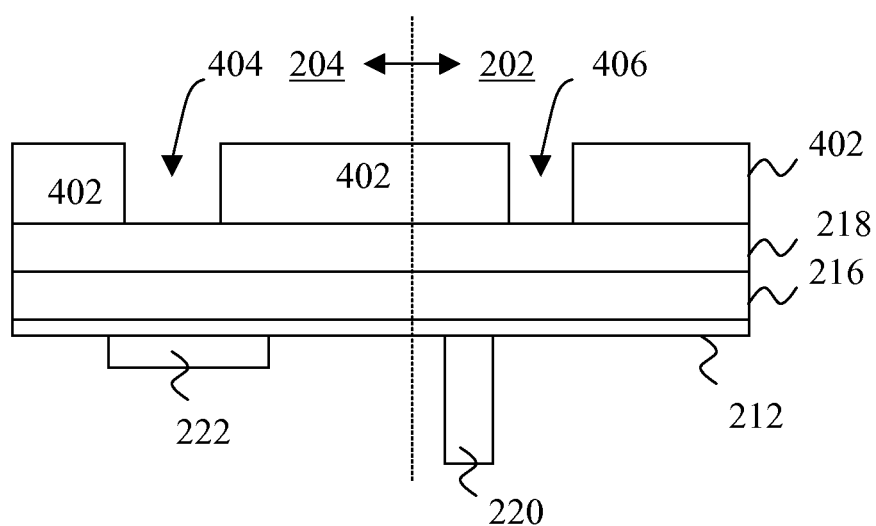
FIG. 4 shows a process step according to one embodiment of the present invention.

FIG. 4 shows one embodiment of a processing method according to the present invention. The oxide layer 216 and the outer nitride layer 218 are assumed to have been placed and finalized during prior processing steps. At this stage, a solder ball and the trench are to be added. A layer of photo resist 402 is placed on top of the outer nitride layer. The photo resist layer 402 is patterned and etched to create vias 404 and 406. The via 404 is arranged to overlay the solder connection base 222. The trench 406 is arranged to overlay a portion of the passive area 202 and further from the active area 204 than the crack stop 220.

In the embodiment shown in FIG. 4, the structure is then etched to remove the outer nitride layer 218 and the oxide layer 216 below the via 404 and trench 406. As shown above, a solder ball receiver (not shown) will be connected to the solder connection base 222. As such, one of ordinary skill in the area will realize that trench 406 will extend down to the base nitride layer 212. This embodiment may have limited ability to adjust the aspect ratio of the trench created under trench 406.

Figure 5:
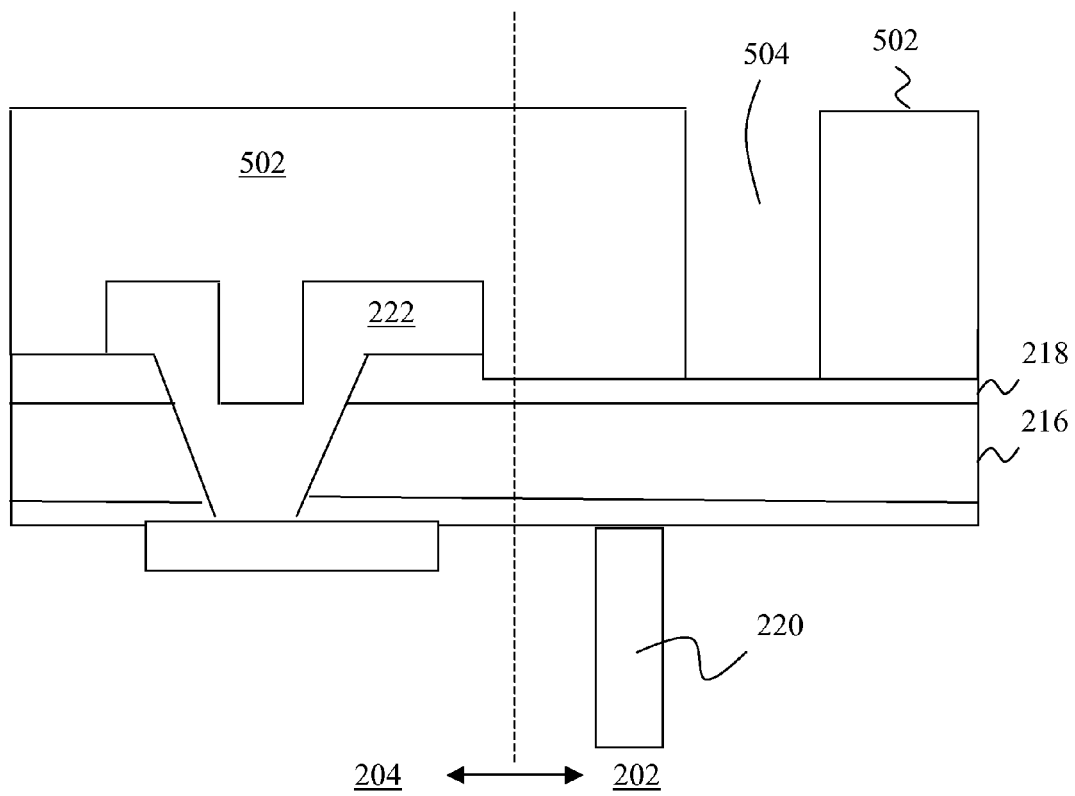
FIG. 5 shows a process step according to another embodiment of the present invention.

FIG. 5 shows another embodiment of a processing method according to the present invention. This embodiment may allow for more control of the characteristics of the trench that is created. In this embodiment, after the solder connection base 222 has been placed, a layer of photo resist 502 is place over the structure. The photo resist layer 502 is patterned and etched to create a via 504. The via 504 is arranged to overlay a portion of the passive area 220 and further from the active are 204 than the crack stop 220. As one of ordinary skill in the art will realize, the trench may now be created, and the characteristics thereof controlled, by etching thought via 504.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a first integrated circuit, the method comprising:
   forming a plurality of integrated circuits on a wafer including a passivation layer;
   defining cut lines between the integrated circuits;
   forming a trench around each of the integrated circuits between the cut lines and integrated circuit, forming including:
      depositing a layer of photoresist on top of the passivation layer;
      exposing the passivation layer in a region between the integrated circuit and the cut lines by patterning and etching the photo resist;
      etching the passivation layer; and
   cutting the wafer along the cut lines.

2. The method of claim 1, further comprising:
   coupling the first integrated circuit to an external circuit.

3. The method of claim 2, further comprising:
   applying underfill between the external circuit and the first integrated circuit, the underfill filling the trench.

4. The method of claim 1, wherein etching the passivation layer includes etching completely through an outer nitride layer which forms part of the passivation layer.

5. The method of claim 4, wherein etching the passivation layer further includes etching partially through an oxide layer which forms part of the passivation layer.

6. The method of claim 4, wherein etching the passivation layer further includes etching completely through an oxide layer which forms part of the passivation layer.

* * * * *